United States Patent [19]
Chen

[11] Patent Number: 5,752,045
[45] Date of Patent: May 12, 1998

[54] POWER CONSERVATION IN SYNCHRONOUS SRAM CACHE MEMORY BLOCKS OF A COMPUTER SYSTEM

[75] Inventor: David Yu Chen, Taipei, Taiwan

[73] Assignee: United Microelectronics Corporation, Hsinchu, Taiwan

[21] Appl. No.: 502,059

[22] Filed: Jul. 14, 1995

[51] Int. Cl.[6] .................................................. G06F 1/32
[52] U.S. Cl. ................................... 395/750; 364/707
[58] Field of Search ................................. 395/750, 707

[56] References Cited

U.S. PATENT DOCUMENTS

| | | | |
|---|---|---|---|
| 5,018,061 | 5/1991 | Kishigami et al. | 364/200 |
| 5,452,401 | 9/1995 | Lin | 395/750 |
| 5,530,932 | 6/1996 | Carmean et al. | 395/750 |
| 5,539,681 | 7/1996 | Alexander et al. | 364/707 |

*Primary Examiner*—Jack B. Harvey
*Assistant Examiner*—Jigar Pancholi
*Attorney, Agent, or Firm*—Cushman Darby & Cushman IP Group of Pillsbury Madison & Sutro LLP

[57] ABSTRACT

A synchronous cache memory power conservation apparatus for conserving power of the cache SRAM memory blocks in cached computer systems. The power conservation apparatus is included as a portion of the logic of the cache controller of the computer system. The power conservation apparatus monitors the CPU bus cycles in order to shut off the clocking signals supplied to the cache SRAM memory blocks when the CPU is not accessing the cache memory, thereby reducing the power consumption of the high-power SRAM devices. The power conservation apparatus resumes standard synchronized clocking to the cache SRAM blocks when the CPU is performing a cache-hit memory access cycle for maximum cache access performance.

5 Claims, 3 Drawing Sheets

POWER CONSERVATION IN SYNCHRONOUS SRAM CACHE MEMORY BLOCKS OF A COMPUTER SYSTEM

BACKGROUND OF THE INVENTION

1. Field of the Invention

The present invention relates to the control of a computer system cache memory subsystem. In particular, the present invention relates to the control used for power conservation in the computer system cache memory subsystem. More particularly, the present invention relates to a power conservation apparatus that allows for full speed access to cache memory blocks when there is a cache hit condition, and allows the cache memory blocks to remain in an idling power down mode that will reduce power consumption.

2. Description of Related Art

Semiconductor microprocessors are frequently utilized as the central processing units (CPU) for computer systems. Advancements in microprocessor technology, in particular, an increase in the operating clock frequency as one of the measures to improve the computing power of microprocessors, has raised the operating clock frequency of the CPU beyond the normal operating clock frequency of virtually all other constituent components in a microprocessor-based computer system.

In microprocessor-based personal computer systems or workstations, for example, an increase of the CPU operating clock frequency has brought about the widespread use of fast SRAM blocks as the cache memory subsystem for a computer system. The basic idea of the cache memory subsystem in a computer system is to boost the performance of a reasonably-priced computer system with its main memory block built around relatively cheap and plentiful DRAM blocks to about 80–90% of the performance of a system using all SRAM main memory blocks. For example, in the widely used IBM-compatible Intel 486-based personal computers, a cache hit rate of about 90% can be achieved with the use of a 256 K-byte cache memory block when running popular business application programs.

Thus, SRAM devices have become indispensable components in common personal computer systems. However, the technology of reasonably-priced commercial SRAM device fabrication does not allow the use of mass production SRAM memory devices to construct a cache memory subsystem that can match the speed of the fastest CPUs. In other words, cache memory subsystems constructed utilizing conventional SRAM devices are having difficulty keeping up with the high clock rate of the CPU in many computer systems.

As a result, most current microprocessor-based computer systems now employ an asynchronous scheme for the SRAM cache memory subsystem to interface to the CPU of the computer system. This asynchronous scheme allows the slower cache SRAM blocks to operate at a relatively slower clock rate. On the other hand, however, asynchronous cache memory blocks require additional wait states that the CPU has to insert to allow for the relatively slower cache SRAM to catch up.

A good computer system design minimizes the number of instances when the CPU is in an idling state. The synchronous cache scheme provides for the elimination of the inserted CPU wait states as in the case of the above-mentioned asynchronous arrangement. The synchronous SRAM cache subsystem allows the cache blocks to operate at a clock frequency that is synchronous with the CPU clock rate. By operating at the same clock rate as that of the CPU, SRAM devices in the cache memory blocks can respond to the CPU access requirements without requiring the CPU to insert wait states for the access result. A brief examination of the conventional synchronous SRAM cache memory subsystem for a typical microprocessor-based computer follows to assist in understanding the background of the present invention.

FIG. 1 is a block diagram showing the structural components in a typical computer system that include a synchronous SRAM block as its cache memory subsystem. As is seen in the drawing, in a typical computer system employing synchronous SRAM cache memory blocks, the CPU 10 has its data bus tied directly to the data bus of the synchronous SRAM blocks 20. The same clock source is employed to drive both the CPU 10 and the synchronous SRAM blocks 20, as can be seen by the common clock CLK signal.

In a memory access operation in the computer system initiated by the CPU 10, the CPU 10 issues an address, which has a portion extracted and compared with the tag address stored in a corresponding location of the tag RAM 30. The result of the comparison, a cache hit or cache miss, is sent to the cache controller 40 to generate the appropriate cache SRAM access signals that are required to directly control the access of the synchronous SRAM blocks 20. If the result of comparing the contents of the tag RAM 30 and the CPU-issued address indicates a cache hit as signified by the HIT/MISS# signal in the drawing, then it indicates the fact that the data targeted by the CPU-issued address is already in the SRAM blocks 20, and can be directly retrieved from the SRAM blocks 20. If the comparison result is otherwise, then the data addressed by the CPU 10 is not currently in the cache SRAM blocks 20, and must be retrieved from outside of the SRAM blocks.

The role of the cache controller 40 is to control the interface to the synchronous cache SRAM blocks 20. The access to the SRAM blocks 20 may be initiated by the CPU 10, or by other bus master devices residing on the bus 60 of the system.

The cache controller 40 is driven at the same clock rate as that of both the CPU 10 and SRAM blocks 20, by the CLK clock signal. It provides for controlling the coupling of the SRAM blocks 20 to the CPU 10, as well as to other bus master devices residing on the bus 60, by responding to the control signals as defined by the I/O cycle, idle state, as well as the address strobe signals issued by the CPU 10 or other devices residing on the bus 60.

However, as persons skilled in this art may well appreciate, SRAM devices operating at a high clock rate consume large amounts of power. In general, SRAM devices consume more power as the clock rate increases. As a practical example, in a computer system employing the Intel Pentium microprocessor as the CPU and a 256 K-byte level-two synchronous cache SRAM memory block, a power of about 6 to 7 watts would be consumed by the SRAM blocks alone, assuming the use of four SRAM IC devices each consuming a nominal 300 mA at 5-volts (300 mA×5 V×4=6 W). This power is almost comparable to the power consumption of the CPU itself. If the cache memory size is doubled to 512 K-bytes, the power consumption by the SRAM block jumps to about 12 to 14 watts. This causes the entire computer system to exceed the power consumption limit set by the widely adopted Green PC standard.

SUMMARY OF THE INVENTION

It is an object of the present invention to provide a synchronizing cache memory power conserving apparatus for cached computer systems that allows high speed cache memory access when a cache hit condition occurs.

It is another object of the present invention to provide a synchronizing cache memory power conserving apparatus for cached computer systems that allows cache memory blocks to remain in an idling power down mode to conserve power when the CPU of the computer system is not accessing the cache memory.

The present invention achieves the above-identified objects by providing a cache memory power conserving apparatus for controlling the cache SRAM blocks in a computer system. The computer system includes a CPU, a number of cache SRAM blocks coupled to a local bus of the CPU, a cache controller coupled to the cache SRAM blocks, and a bus coupling the CPU and cache controller.

The CPU and the cache controller are driven by the same CPU clock pulse. The cache memory power conserving apparatus is included in the cache controller and comprises synchronization logic coupled to the bus for monitoring the CPU status signals as conveyed on the local bus for generating a first selection signal when the CPU is in the idling cycle.

The synchronization logic generates a second selection signal when the CPU is in a cache hit memory access cycle. The power conserving apparatus also comprises a multiplexer having the multiplexed output thereof coupled to the cache SRAM blocks. The multiplexer receives the selection signal generated by the synchronization logic, and multiplexes the CPU clock pulse to the cache SRAM blocks when the first selection signal is generated, thus allowing synchronized CPU access to the cache SRAM blocks. The multiplexer multiplexes a static signal to the cache SRAM blocks when the second selection signal is generated, allowing the cache SRAM blocks to remain in a power conserving mode.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Figure 1:
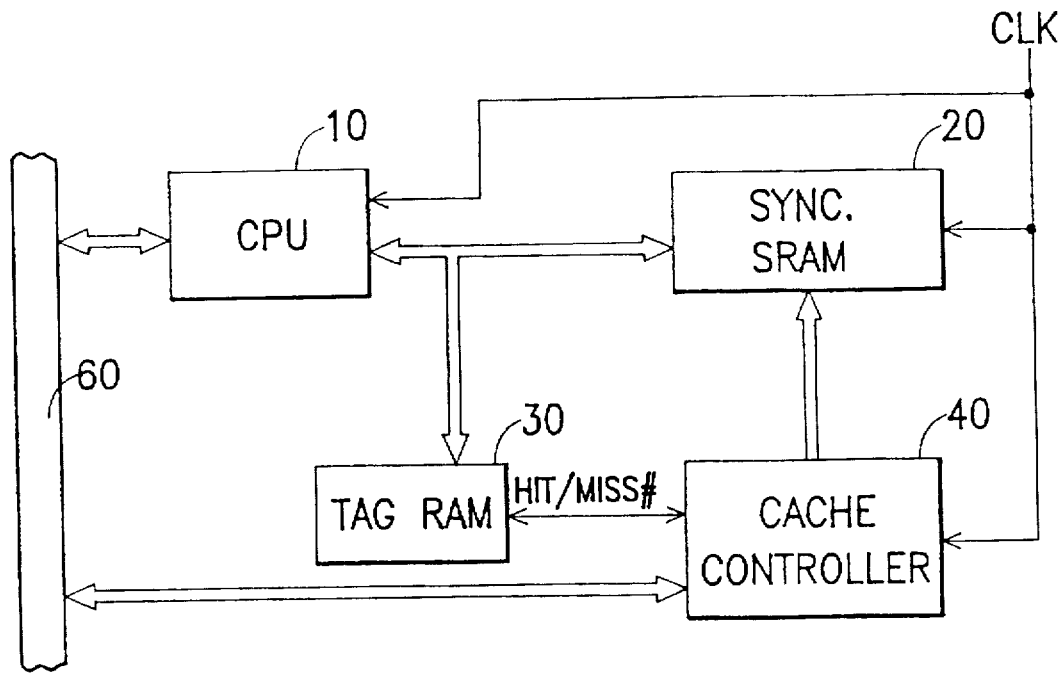
FIG. 1 is a block diagram showing the conventional computer configuration in a computer system that include a synchronous SRAM block as the cache memory subsystem.
Figure 2:
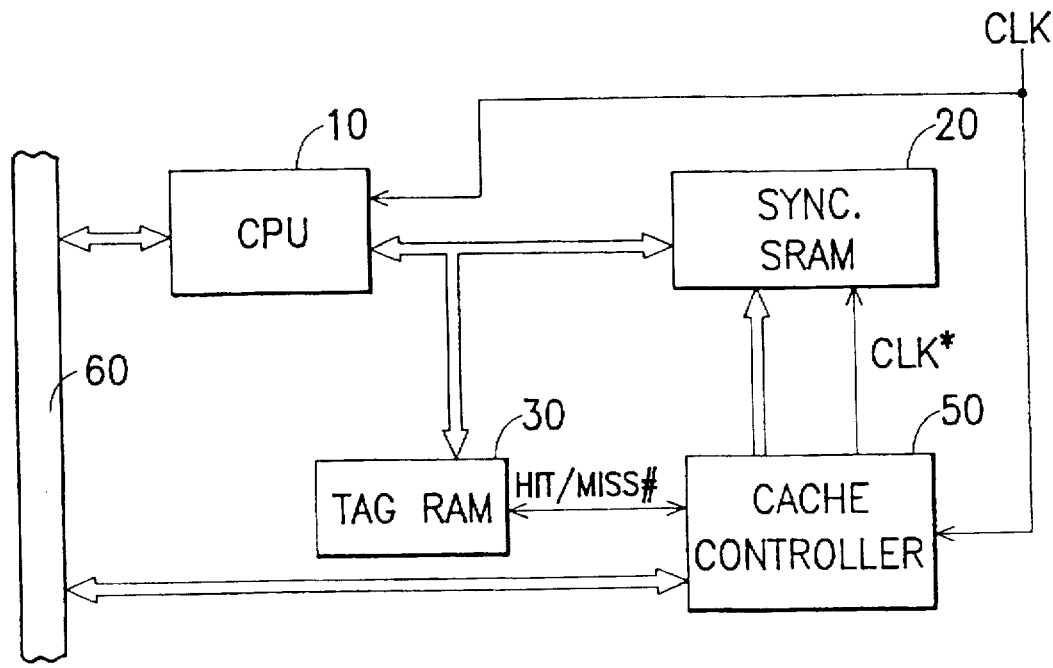
FIG. 2 is a block diagram showing the computer configuration in accordance with a preferred embodiment of the present invention.

FIG. 2 is a block diagram showing the configuration of a computer system in accordance with a preferred embodiment of the present invention. As was in the case of the conventional SRAM-cached computer systems, the CPU 10 has its data bus tied directly to the data bus of the synchronous SRAM blocks 20. The CPU 10 is driven with the CPU clock CLK, as seen in the drawing. The synchronous SRAM blocks 20, on the other hand, are not driven directly by the same clock source that drives the CPU 10. Instead, they operate at a frequency defined by a clock source CLK* that is generated by the cache controller 50. Notice, however, that the cache controller 50 operates using the same clock source as that of the CPU 10, CLK. A tag RAM 30, as in the normal cached computer systems, is utilized to store the address tags of the accessed address locations that are involved in the memory access.

In a memory data access operation in the computer system initiated by the CPU 10, the CPU 10 issues an address, which has a portion extracted and compared with the tag address stored in a corresponding location of the tag RAM 30. The comparison can be conducted by the cache controller 50 at the same operating clock frequency as that of the CPU 10. Normally, the comparison would be completed within a limited time once the memory access address is released by the CPU 10 and remains effective for the supporting logic, such as the cache controller 50. Most frequently, the comparison result is obtained quickly enough for the cache controller 50 to have sufficient time to actually access the SRAM blocks 20 in case a cache hit condition occurs. The best possible cache controller arrangement would have the tag comparison operation and the subsequent SRAM block access completed within the same CPU memory access cycle. This would eliminate the need to insert CPU wait states that retard system performance.

The result of the address tag comparison, that is, the result of either the memory access being a cache hit or miss, is the basis on which the cache controller 50 determines whether or not to generate the CLK* clock signal to allow access to the synchronous SRAM blocks 20. In other words, the SRAM access clocking signal CLK* is not always present for the SRAM blocks 20.

The basic principle for the cache controlling scheme of the present invention is to supply the accessing clock signal CLK* to the SRAM blocks 20 only when the SRAM blocks are to be accessed. In other words, the CLK* signal to the SRAM blocks 20 is only generated when it is determined by the tag comparison result that there has been a cache hit, and the SRAM blocks must be accessed. If the comparison of the tag RAM content for the particular address as issued by the CPU 10 for memory access indicates a cache miss condition, indicating that the required data is not currently in the SRAM blocks 20, then the CLK* clock signal is not generated at all. This is because the SRAM blocks 20 do not need to be accessed, therefore there is no need for the operating clock signal CLK*, the SRAM blocks 20 can be left idling in a low-power state thereby conserving power.

Thus, the synchronous SRAM blocks 20 are only driven by the clock signal CLK* which has the same frequency as that of the driving clock CLK for the CPU 10 when it is necessary to access the SRAM blocks 20. In other words, the supply of the clocking signal CLK* is dependent on the status of the CPU 10. The determination of the operational status of the CPU 10 can be monitored over the bus 60. In the case of Intel Pentium-based computer systems, for example, the CPU status may be interpreted by monitoring the relevant signals of the CPU status which are available on the bus 60. For example, the M/IO# signals as released by the CPU 10 and shown in FIG. 4, indicates that the CPU 10 is either in the memory access or in the I/O access cycle. If the CPU is in a memory access cycle, the ADS# (see FIG. 4) signal signifies the issuing of the address by the CPU 10. Other cache interfacing signals can also be utilized to determine the CPU status. These signals can be the basis for a decision of whether or not to generate the CLK* signal for the SRAM blocks 20. In the case of a confirmed cache memory access situation, the cache controller 50 can, in addition to the generation of the CLK* signal, also issue the other memory strobing signals for the SRAM blocks 20.

When the cache controller 50 determines that the synchronous SRAM memory blocks 20 are not going to be accessed, the CLK* signal is not generated. The CLK* signal can be either a logical high or low signal. This allows the SRAM devices in the synchronous SRAM blocks 20 to be in their low-power idle mode. In other words, the SRAM devices in the blocks 20 are not accessed for as long as they are not needed. Idling SRAM devices consume much less power than when they are being read from or written to at the high clock rate of the CPU.

Figure 3:
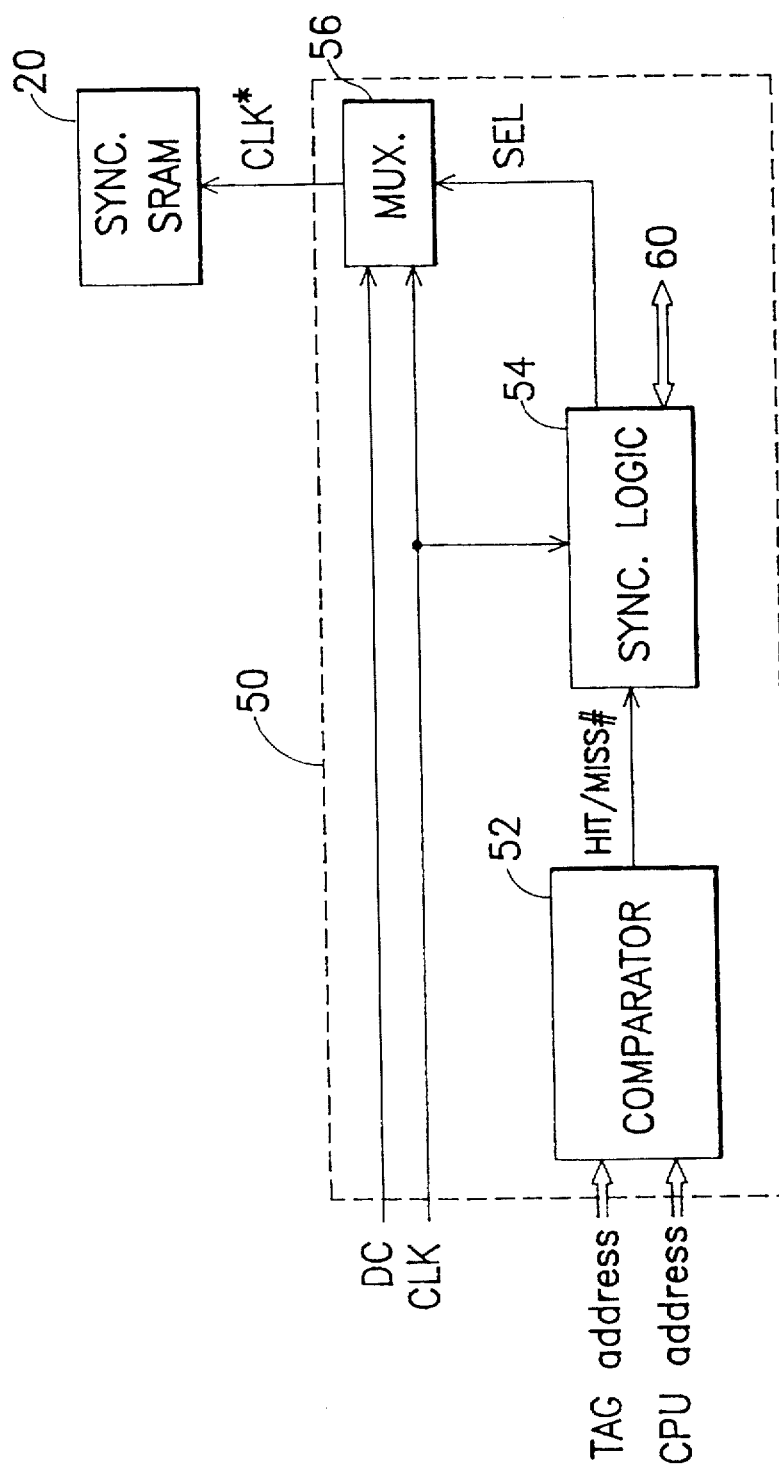
FIG. 3 is a block diagram showing the details of the cache controller of FIG. 2.

FIG. 3 is a block diagram showing the detail of the configuration of the cache controller of FIG. 2 of the present invention. As is seen in the drawing, the cache controller 50 comprises a comparator 52, a synchronization logic 54, and a multiplexer 56 and SRAM memory blocks 20 are also shown for reference in FIG. 3. The comparator 52 receives the inputs from both the CPU 10 and the tag RAM 30. The input from CPU 10 is the address issued for the memory access, and the input from the tag RAM 30 is the recorded address tag that corresponds to the address issued by the CPU 10. The tag address contained in the tag RAM 30 is compared with the most significant bits of the address issued by the CPU 10 to check for equality. If the result is positive, the signal HIT/MISS# indicating a cache hit is output to the synchronization logic 54. If the result of the comparison is negative, then the signal HIT/MISS# signifying the cache miss is sent to the synchronization logic 54 instead.

The synchronization logic 54 is driven by the CPU clock signal CLK and receives the HIT/MISS# signal as issued by the comparator 52. The synchronization logic 54 also receives CPU status signals such as ADS# and M/IO# via the bus 60 to monitor the status of the CPU 10. These CPU status signals, together with the HIT/MISS# signal, are utilized by the logic circuitry in the synchronization logic 54 to generate a selection signal SEL. The selection signal SEL is output to a multiplexer 56 that uses the selection signal SEL to select one of its two other input sources for output as signal CLK* to the SRAM blocks 20.

As described above, when the CPU registers a cache hit, the CLK clock signal for the CPU 10, would then be selected by the multiplexer and is multiplexed to the SRAM blocks 20 as the CLK* clock signal. When the CPU registers a cache miss, a low level DC signal is sent to the SRAM blocks 20. When the selected signal is the DC signal, the SRAM devices in the SRAM memory blocks 20 are placed in the idle state and consume minimum power. When a cache hit occurs, the SRAM devices in the SRAM blocks 20 are then driven by the multiplexed CPU clock signal CLK. This allows the cache SRAM subsystem 20 to operate at full speed using a synchronized and multiplexed version of the CLK clock, namely the CLK* clocking signal.

Figure 4:
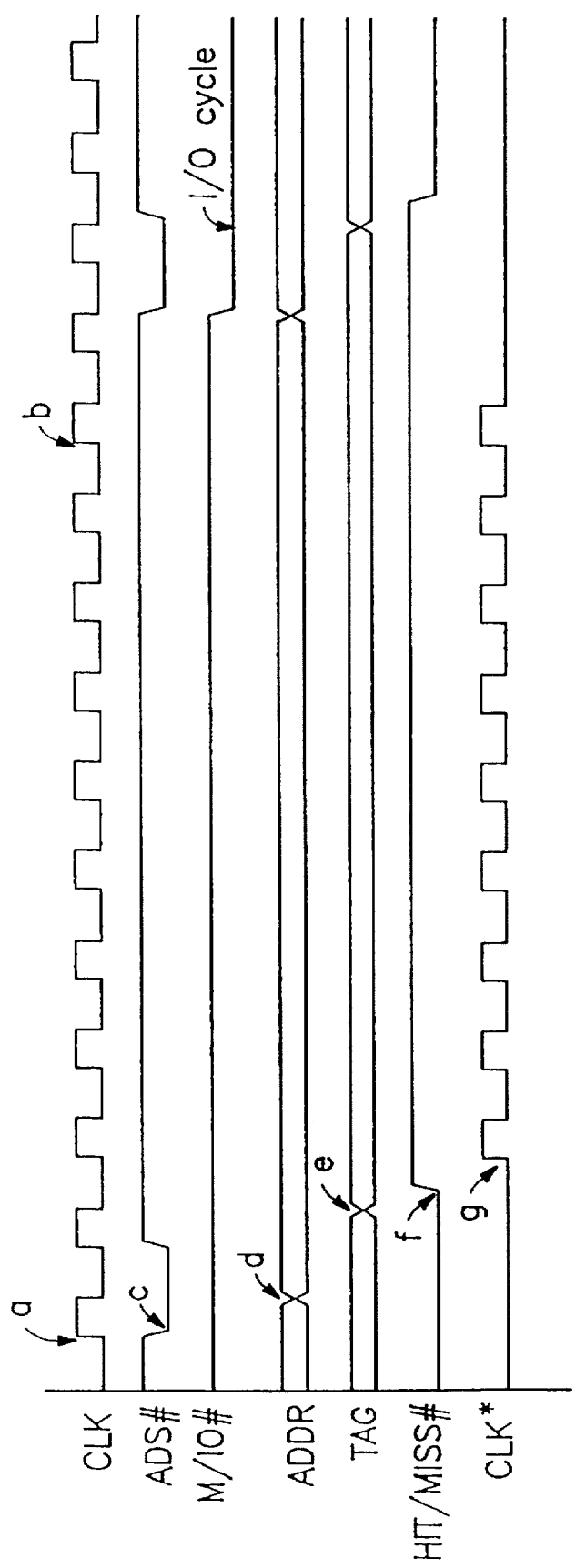
FIG. 4 is a time diagram showing the relative signal timing sequence of the signals in the bus and the signals in the cache controller in reference to the clock signal.

FIG. 4 depicts a timing diagram showing the timing sequence of the signals in the bus 60 and the signals in the cache controller 50 in reference to the clock signal. As is seen in the timing diagram, the CPU clock signal CLK is utilized as the comparison time base, and the CPU status signals ADS# and M/IO# are used to indicate the CPU cycle status. The timing of the CPU-issued address, namely the ADDR bus is also included. The tag address, TAG, and the cache hit and miss status HIT/MISS# signal, as well as the clocking signal for the SRAM blocks CLK*, are all included in the timing diagram for a description of the operation of the cache controller 50.

In the timing diagram, ten CPU clock cycles constitutes one bus cycle, identified by the reference numerals a and b denoting the first and the tenth clock pulse respectively. During this bus cycle (from a to b), after the start, at time c, the CPU 10 issues the active-low address status signal ADS# indicated by a transition from a high to a low level. With the appearance of this signal, CPU 10 indicates that at time d an address ADDR is being released on the CPU address bus in a new and valid bus cycle driven by the processor. As is seen in the timing diagram, this occurs immediately after the initiation of the bus cycle as signified by the rising edge of the first CPU clock pulse CLK at time a.

Then, receiving the CPU address ADDR, the cache controller 50 reads the corresponding location in the tag RAM 30 at time e in order to compare it to signal ADDR if there is a cache hit or a cache miss access cycle. The result of the comparison by the cache controller 50 of the address bits ADDR and the tag TAG, is output as the HIT/MISS# signal at time f. As was described in FIGS. 2 and 3, this cache hit/miss signal HIT/MISS# is then sent to the synchronization logic 54 for the generation of the selection signal SEL that directly controls the multiplexer 56. If there has been a cache hit condition, the CLK* signal for the high speed access to the SRAM blocks 20 is multiplexed to the SRAM blocks at time g. The CLK* signal supplied to the SRAM blocks 20 is operational for the entire bus cycle from a to b. After the completion of the bus cycle, a new process may begin if it is determined that another memory access cycle is again initiated by the CPU 10. Otherwise, the CLK* signal is multiplexed as a DC signal, allowing the SRAM blocks 20 to idle and to thereby conserve power.

In typical microprocessor-based computer systems, for example, the Intel Pentium-based systems, there is an average of about 20% of the CPU bus cycle dedicated to cache SRAM accesses. In the example of a synchronous cache SRAM memory subsystem controlled using the scheme of the present invention, which only operates at the full clock rate of 66 MHz when there is a cache hit condition, and with a nominal access current consumption of 300 mA per SRAM device, the conserved power in comparison to the conventional full-time clocked synchronous cache SRAM subsystems would be:

$$Pc = 300 \text{ mA/chip} \times 4 \text{ chips} \times 5 \text{ V} \times 80\% = 4.8 \text{ W}.$$

This assumes a synchronous SRAM memory subsystem employing a memory block of four SRAM IC's in a 32-bit structure, for example, the Intel 486 computer system. Since, as mentioned above, there is an average hit rate of about 90% of the memory access cycles for typical second-level-cached computer systems, during the operation of the above exemplified four-chip SRAM computer system, a power conservation of about 4.5 watts is possible. In the case of the Pentium-based computer systems that require at least eight SRAM chips to construct a cache block of 64 bits, the conservation would amount to nearly 9 watts.

Thus, with the cache controlling apparatus of the present invention, drastic power conservation can be achieved in a secondary-cached computer system, while still allowing the cache SRAM subsystem to operate at its maximum permissible performance conditions, namely, in the clock mode synchronous with the clocking of the CPU of the system. Minimum possible insertion of the CPU wait states concerning the access to the memory subsystem is achieved via the use of the cache controller and controlling scheme of the present invention.

What is claimed is:

1. A cache memory power conserving apparatus for controlling a plurality of cache SRAM blocks in a computer system, said computer system including a CPU, a first signal bus, said plurality of cache SRAM blocks coupled to said first signal bus, a cache controller coupled to said plurality of cache SRAM blocks, and a second signal bus coupling said CPU and said cache controller, wherein said CPU and said cache controller are driven by a same CPU clock pulse, and said cache memory power conserving apparatus is included in said cache controller and comprises:

synchronization logic coupled to said second signal bus of said CPU to monitor CPU status signals as conveyed on said second signal bus to generate a first selection signal when said CPU is in an idling cycle, and to generate a second selection signal when said CPU is in a cache hit memory access cycle; and a multiplexer having an output coupled to said plurality of cache SRAM blocks and receiving one of said first selection signal and said second selection signal generated by said synchronization logic, wherein said multiplexer multiplexes said same CPU clock pulse to said plurality of cache SRAM blocks when said second selection signal is received from said synchronization logic, allowing for synchronized CPU access to said plurality of cache SRAM blocks, and said multiplexer multiplexes a static signal to said plurality of cache SRAM blocks when said first selection signal is received from said synchronization logic, allowing said plurality of cache SRAM blocks to remain in an idling power conserving mode.

2. The cache memory power conserving apparatus of claim 1, wherein said plurality of cache SRAM blocks comprise synchronous SRAM devices.

3. The cache memory power conserving apparatus of claim 2, wherein said cache controller further comprises a comparator for comparing an address issued by said CPU in a memory access cycle, said comparator determining an occurrence of a cache hit condition in said memory access cycle.

4. The cache memory power conserving apparatus of claim 3, wherein said cache controller further comprises a tag RAM to store a tag address for said address issued by said CPU in said memory access cycle.

5. The cache memory power conserving apparatus of claim 1, wherein said static signal multiplexed to said plurality of cache SRAM blocks is a ground signal.

* * * * *